United States Patent
Shin et al.

(10) Patent No.: US 7,558,128 B2
(45) Date of Patent: Jul. 7, 2009

(54) SEMICONDUCTOR MEMORY DEVICE HAVING A VOLTAGE BOOSTING CIRCUIT

(75) Inventors: Chang-Ho Shin, Suwon-si (KR); Jong-Hyun Choi, Suwon-si (KR)

(73) Assignee: Samsung Electronics. Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/473,402

(22) Filed: Jun. 24, 2006

(65) Prior Publication Data
US 2006/0291279 A1 Dec. 28, 2006

(30) Foreign Application Priority Data
Jun. 24, 2005 (KR) .................... 10-2005-0055278

(51) Int. Cl.
*G11C 5/14* (2006.01)
(52) U.S. Cl. ............... 365/189.09; 365/189.11; 365/226
(58) Field of Classification Search ............ 365/189.09, 365/230.06, 226
See application file for complete search history.

(56) References Cited

U.S. PATENT DOCUMENTS

| 6,483,357 | B2 * | 11/2002 | Kato et al. .................. 327/143 |
| 6,751,132 | B2 * | 6/2004 | Jang et al. .............. 365/189.09 |
| 2004/0004876 | A1 * | 1/2004 | Choi et al. .................. 365/202 |

FOREIGN PATENT DOCUMENTS

| JP | 2000 285673 | 10/2000 |
| JP | 2002 153044 | 5/2002 |
| KR | 2004 0046019 | 6/2004 |
| KR | 2004 0000880 | 7/2004 |
| KR | 1020040102610 | 12/2004 |
| KR | 2005 0013776 | 5/2005 |

OTHER PUBLICATIONS

English Abstract of Publication No. 1020040000880.
English Abstract of Publication No. 1020050013776.
English Abstract of Publication No. 2000-285673.
English Abstract of Publication No. 2000-153044.
English Abstract of Publication No. 2004-0046019.
English Abstract for Publication No. 1020040102610.

* cited by examiner

*Primary Examiner*—Hoai V Ho
*Assistant Examiner*—Kretelia Graham
(74) *Attorney, Agent, or Firm*—F. Chau & Associates, LLC

(57) ABSTRACT

A semiconductor memory device includes a cell array internal voltage generating circuit for generating cell array reference voltage and a cell array internal voltage from a first external power voltage, a peripheral circuit internal voltage generating circuit for generating a peripheral circuit reference voltage and a peripheral circuit internal voltage from the first external power voltage, and a voltage boosting circuit power voltage generating circuit for generating a voltage boosting circuit reference voltage and a voltage boosting circuit power voltage from a second external power voltage.

7 Claims, 7 Drawing Sheets

SEMICONDUCTOR MEMORY DEVICE HAVING A VOLTAGE BOOSTING CIRCUIT

CROSS-REFERENCE TO RELATED APPLICATION

This application claims the benefit of Korean Patent Application No. 10-2005-0055278, filed Jun. 24, 2005, in the Korean Intellectual Property Office, the disclosure of which is hereby incorporated herein by reference in its entirety.

BACKGROUND OF THE INVENTION

1. Field of the Invention

The present invention relates to a semiconductor memory device, and more particularly to a semiconductor memory device in which a boosted voltage having a high voltage level is generated during low power operation.

2. Description of Related Art

A semiconductor memory device such as a dynamic random access memory (DRAM) has a voltage boosting circuit. The voltage boosting circuit generates a boosted voltage having a higher voltage level than an external power voltage.

The boosted voltage can be used to compensate voltage loss of a transistor and enhance speed of the device. A word line driver circuit, a bit line isolation circuit, and a data output buffer circuit are examples of circuits that use the boosted voltage to compensate voltage loss, and maintain data and high-speed operation.

The voltage boosting circuit is supplied with a cell array internal voltage and a peripheral circuit internal voltage as its power voltage, or operating voltage, to generate the boosted voltage. Typically, the cell array internal voltage and the peripheral circuit internal voltage are lowered implement a low-power semiconductor memory device. A level of the boosted voltage is not substantially lowered due to characteristics of circuits which use the boosted voltage.

The voltage boosting circuit may not be able to generate the boosted voltage when the cell array internal voltage or the peripheral circuit internal voltage has a low voltage level. If the voltage boosting circuit generates the boosted voltage by using the cell array internal voltage or the peripheral circuit internal voltage having a low voltage level, an electric charge pump having an increased size or complicated circuit structure are needed to generate the boosted voltage.

To generate the boosted voltage, the voltage level of the cell array internal voltage or the peripheral circuit internal voltage needs to be maintained at an elevated level, higher than a voltage level that may otherwise be achievable for low-power operation.

The semiconductor memory device additionally employs a voltage boosting circuit power voltage generating circuit, which generates a power voltage of the voltage boosting circuit as shown in FIG. 1.

FIG. 1 is a block diagram illustrating the semiconductor device. The semiconductor memory device of FIG. 1 includes a cell array internal voltage generating circuit 1, a peripheral circuit internal voltage generating circuit 2, a voltage boosting circuit power voltage generating circuit 3, and a voltage boosting circuit 4. The cell array internal voltage generating circuit 1 includes a reference voltage generating circuit 11 and an internal voltage driving circuit 12. The peripheral circuit internal voltage generating circuit 2 includes a reference voltage generating circuit 21 and an internal voltage driving circuit 22. The voltage boosting circuit power voltage generating circuit 3 includes a reference voltage generating circuit 31 and an internal voltage driving circuit 32. The voltage boosting circuit 4 includes a boosted voltage level detecting circuit 41, a control signal generating circuit 42, and an electric charge pump circuit 43.

The semiconductor memory device of FIG. 1 is supplied with one external power voltage VEXT.

The reference voltage generating circuits 11, 21, and 31 are circuits which generate reference voltages REF_A, REF_P, and REF_VPP, respectively, having a constant level regardless of a voltage level of the external power voltage VEXT or an operating temperature of the semiconductor memory device. The reference voltage generating circuit 11 generates a cell array reference voltage REF_A having a prescribed level from the external power voltage VEXT. The reference voltage generating circuit 21 generates a peripheral circuit reference voltage REF_P having a prescribed level from the external power voltage VEXT. The reference voltage generating circuit 31 generates a voltage boosting circuit reference voltage REF_VPP having a prescribed level from the external power voltage VEXT.

The internal voltage driving circuits 12, 22, and 32 are circuits which generate internal voltages VINTA, VINTP, and V_VPP, respectively, according to corresponding reference voltages REF_A, REF_P, and REF_VPP transmitted from the reference voltage generating circuits 11, 21, and 31. The internal voltage driving circuit 12 generates a cell array internal voltage VINTA from the external power voltage VEXT according to the cell array reference voltage REF_A and applies it to the cell array. The internal voltage driving circuit 22 generates a peripheral circuit internal voltage VINTP from the external power voltage VEXT according to the peripheral circuit reference voltage REF_P and applies it to the peripheral circuit. The internal voltage driving circuit 32 generates a voltage boosting circuit power voltage V_VPP from the external power voltage VEXT according to the voltage boosting circuit reference voltage REF_VPP and applies it to the voltage boosting circuit 4.

The boosted voltage level detecting circuit 41 of the voltage boosting circuit 4 detects a voltage level of the boosted voltage VPP and drives the control signal generating circuit 42 when the detected boosted voltage level is lower than the voltage boosting circuit reference voltage REF_VPP. The control signal generating circuit 42 generates a control signal under control of the boosted voltage level detecting circuit 41. The electric charge pump circuit 43 performs charge pumping operation using the voltage boosting circuit power voltage V_VPP in response to the control signal to raise the voltage level of the boosted voltage VPP.

The semiconductor memory device controls the voltage boosting circuit power voltage generating circuit 3 to raise the voltage level of the voltage boosting circuit power voltage V_VPP, thereby generating the boosted voltage VPP having a high voltage level during low-power operation.

In a low-power semiconductor device, the external power voltage of the semiconductor memory device is low, so that the voltage boosting circuit cannot boost the voltage boosting circuit power voltage V_VPP to a desired voltage level.

Therefore, a need exists for a semiconductor memory device in which a boosted voltage having a high voltage level is generated during low power operation.

SUMMARY OF THE INVENTION

According to an embodiment of the present invention, a semiconductor memory device comprises a cell array internal voltage generating circuit for generating cell array reference voltage and a cell array internal voltage from a first external power voltage, a peripheral circuit internal voltage generating circuit for generating a peripheral circuit reference voltage and a peripheral circuit internal voltage from the first external power voltage, and a voltage boosting circuit power voltage generating circuit for generating a voltage boosting circuit reference voltage and a voltage boosting power voltage from a second external power voltage.

According to an embodiment of the present invention, a semiconductor memory device comprises a cell array internal voltage generating circuit for generating cell array reference voltage and a cell array internal voltage from a first external power voltage, a peripheral circuit internal voltage generating circuit for generating a peripheral circuit reference voltage and a peripheral circuit internal voltage from the first external power voltage, and a voltage boosting circuit power voltage generating circuit for generating a voltage boosting circuit reference voltage from a second external power voltage and outputting the second external power voltage as a voltage boosting circuit power voltage.

According to an embodiment of the present invention, a semiconductor memory device, comprises a cell array internal voltage generating circuit for generating cell array reference voltage and a cell array internal voltage from a first external power voltage, a peripheral circuit internal voltage generating circuit for generating a peripheral circuit reference voltage and a peripheral circuit internal voltage from the first external power voltage, and a voltage boosting circuit for generating a boosted voltage using one of the cell array reference voltage and the peripheral circuit reference voltage, and a second external power voltage.

BRIEF DESCRIPTION OF THE DRAWINGS

The present invention will become more apparent to those of ordinary skill in the art by describing in detail preferred embodiments thereof with reference to the attached drawings in which.

DETAILED DESCRIPTION OF PREFERRED EMBODIMENTS

Figure 1:
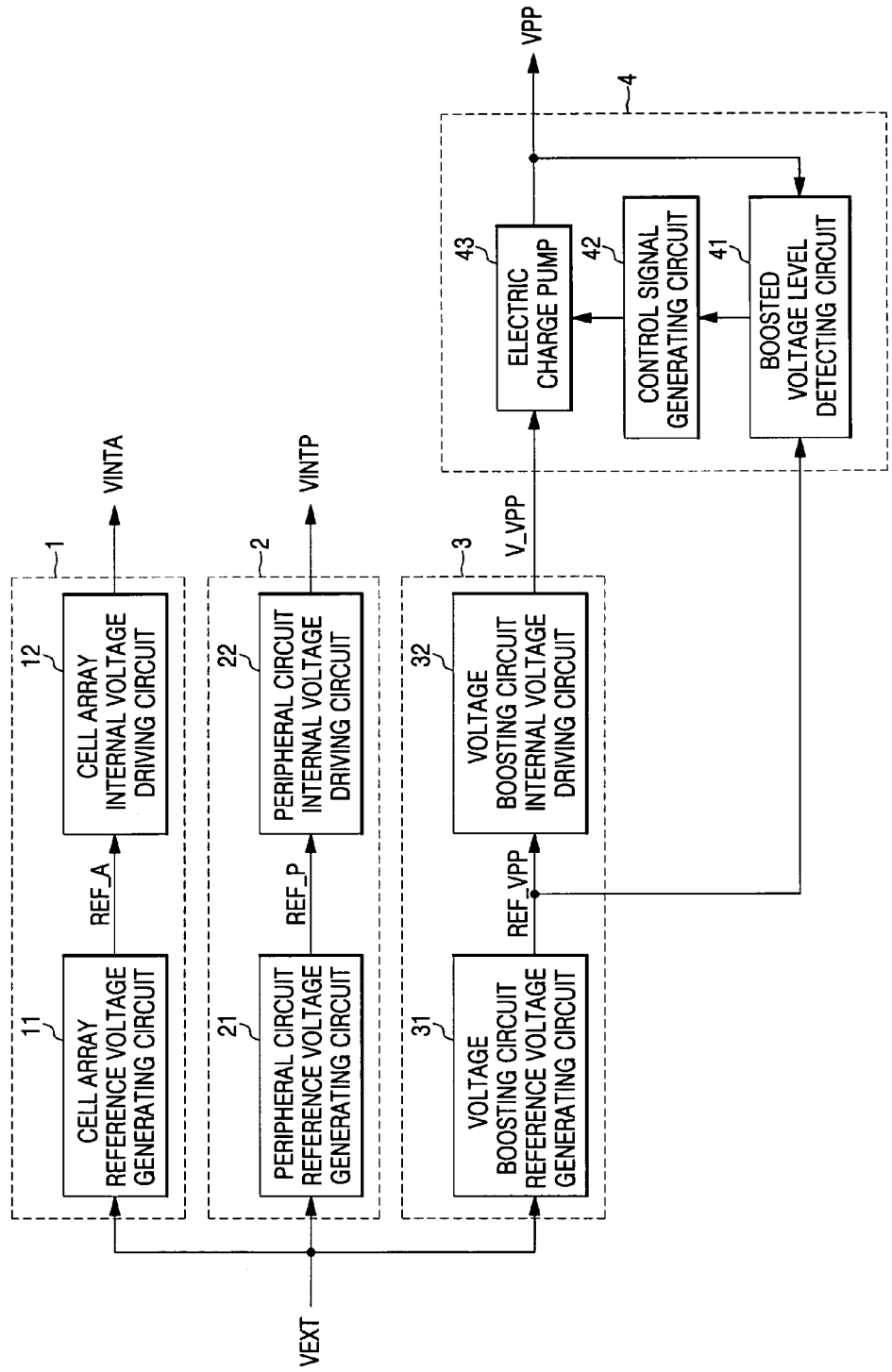
FIG. 1 is a block diagram illustrating a conventional semiconductor device.

Embodiments described herein should not be construed as limiting. Rather, embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
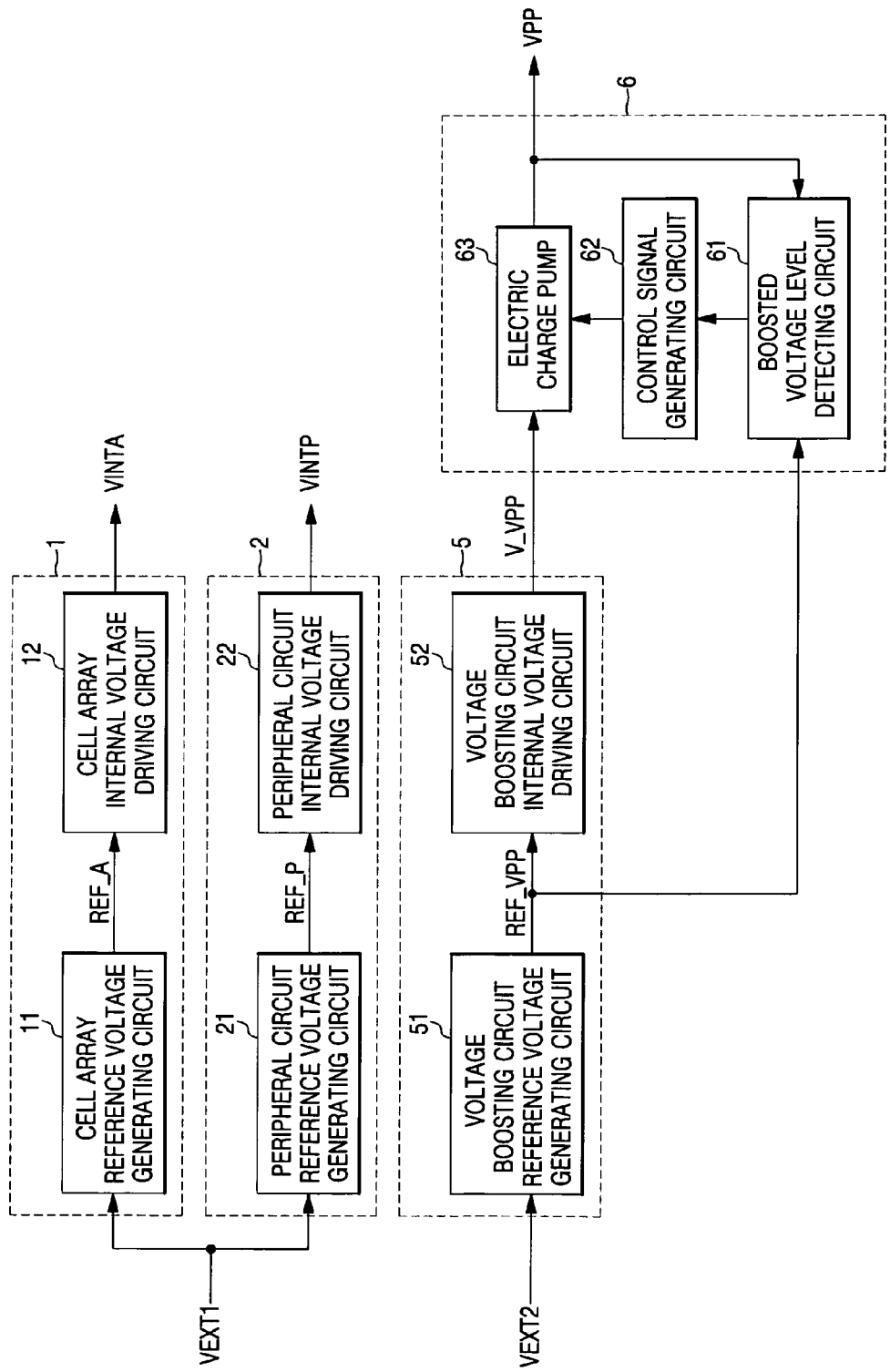
FIG. 2 is a block diagram illustrating a semiconductor memory device according to an embodiment of the present invention.

FIG. 2 is a block diagram illustrating a semiconductor memory device according to an embodiment of the present invention. The semiconductor memory device of FIG. 2 includes a cell array internal voltage generating circuit 1, a peripheral circuit internal voltage generating circuit 2, a voltage boosting circuit power voltage generating circuit 5, and a voltage boosting circuit 6. The cell array internal voltage generating circuit 1 includes a cell array reference voltage generating circuit 11 and a cell array internal voltage driving circuit 12. The peripheral circuit internal voltage generating circuit 2 includes a peripheral circuit reference voltage generating circuit 21 and a peripheral circuit internal voltage driving circuit 22. The voltage boosting circuit power voltage generating circuit 5 includes a voltage boosting circuit reference voltage generating circuit 51 and a voltage boosting circuit internal voltage driving circuit 52. The voltage boosting circuit 6 includes a boosted voltage level detecting circuit 61, a control signal generating circuit 62, and an electric charge pump circuit 63.

The semiconductor memory device of FIG. 2 is supplied with external power voltages VEXT1 and VEXT2. An external power voltage VEXT1 is an external power voltage used in the conventional semiconductor memory device, and an external power voltage VEXT2 is an external power voltage supplied to generate a boosted voltage.

Figure 3:
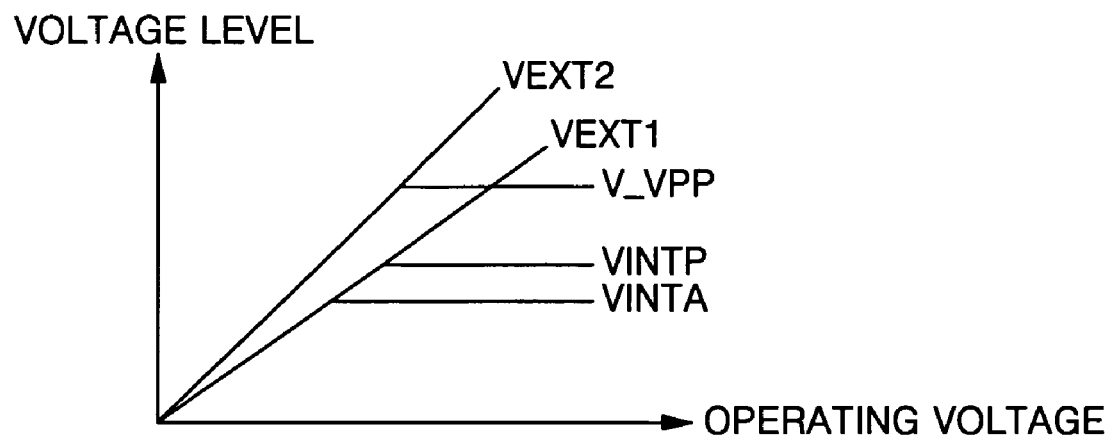
FIG. 3 is a graph illustrating external power voltages according to embodiments of the present invention.

As shown in FIG. 3, the external power voltage VEXT2 is higher in voltage level than the external power voltage VEXT1, and the voltage level of the external power voltage VEXT2 is adjusted according to the operation characteristics of device.

Like reference numerals of FIGS. 1 and 2 denote like parts and perform like operations.

The reference voltage generating circuits 11, 21, and 51 are circuits which generate reference voltages REF_A, REF_P, and REF_VPP, respectively, having a constant level regardless of voltage levels of the external power voltages VEXT1 and VEXT2 or an operating temperature of the semiconductor memory device. The cell array reference voltage generating circuit 11 generates a cell array reference voltage REF_A having a prescribed level from the external power voltage VEXT1. The peripheral circuit reference voltage generating circuit 21 generates a peripheral circuit reference voltage REF_P having a prescribed level from the external power voltage VEXT1. The voltage boosting circuit reference voltage generating circuit 51 generates a voltage boosting circuit reference voltage REF_VPP having a prescribed level from the external power voltage VEXT2.

The internal voltage driving circuits 12, 22, and 32 are circuits which generate respective internal voltages VINTA and VINTP and power voltage V_VPP according to the reference voltages REF_A, REF_P, and REF_VPP transmitted from the reference voltage generating circuits 11, 21, and 51. The internal voltage driving circuit 12 generates a cell array internal voltage VINTA from the external power voltage VEXT1 according to the cell array reference voltage REF_A and applies it to the cell array. The internal voltage driving circuit 22 generates a peripheral circuit internal voltage VINTP from the external power voltage VEXT1 according to the peripheral circuit reference voltage REF_P and applies it to the peripheral circuit. The internal voltage driving circuit 52 generates a voltage boosting circuit power voltage V_VPP from the external power voltage VEXT2 according to the voltage boosting circuit reference voltage REF_VPP and applies it to the voltage boosting circuit 6.

The boosted voltage level detecting circuit 61 of the voltage boosting circuit detects a voltage level of the boosted voltage VPP and drives the control signal generating circuit 62 when the detected boosted voltage level is lower than the voltage boosting circuit reference voltage REF_VPP. The control signal generating circuit 62 generates a control signal under control of the boosted voltage level detecting circuit 61. The electric charge pump circuit 63 performs charge pumping operation using the voltage boosting circuit power voltage V_VPP in response to the control signal to raise the voltage level of the boosted voltage VPP.

Operation of the semiconductor memory device of FIG. 2 is explained below.

The semiconductor memory device is supplied with external power voltages VEXT1 and VEXT2 as shown in FIG. 3.

The cell array and peripheral circuit internal voltage generating circuits 1 and 2 respectively generate the cell array and peripheral circuit internal voltages VINTA and VINTP from the external power voltage VEXT1. The voltage boosting circuit power voltage generating circuit 5 generates the voltage boosting circuit reference voltage REF_VPP and the voltage boosting circuit power voltage V_VPP having a high voltage level, higher than a voltage level of the internal voltages VINTA or VINTP, from the external power voltage VEXT2.

The voltage boosting circuit 6 performs the electric charge pumping operation using the voltage boosting circuit power voltage V_VPP having the high voltage level to raise the voltage level of the boosted voltage VPP when the boosted voltage VPP is lower in voltage level than the voltage boosting circuit reference voltage REF_VPP.

Figure 4:
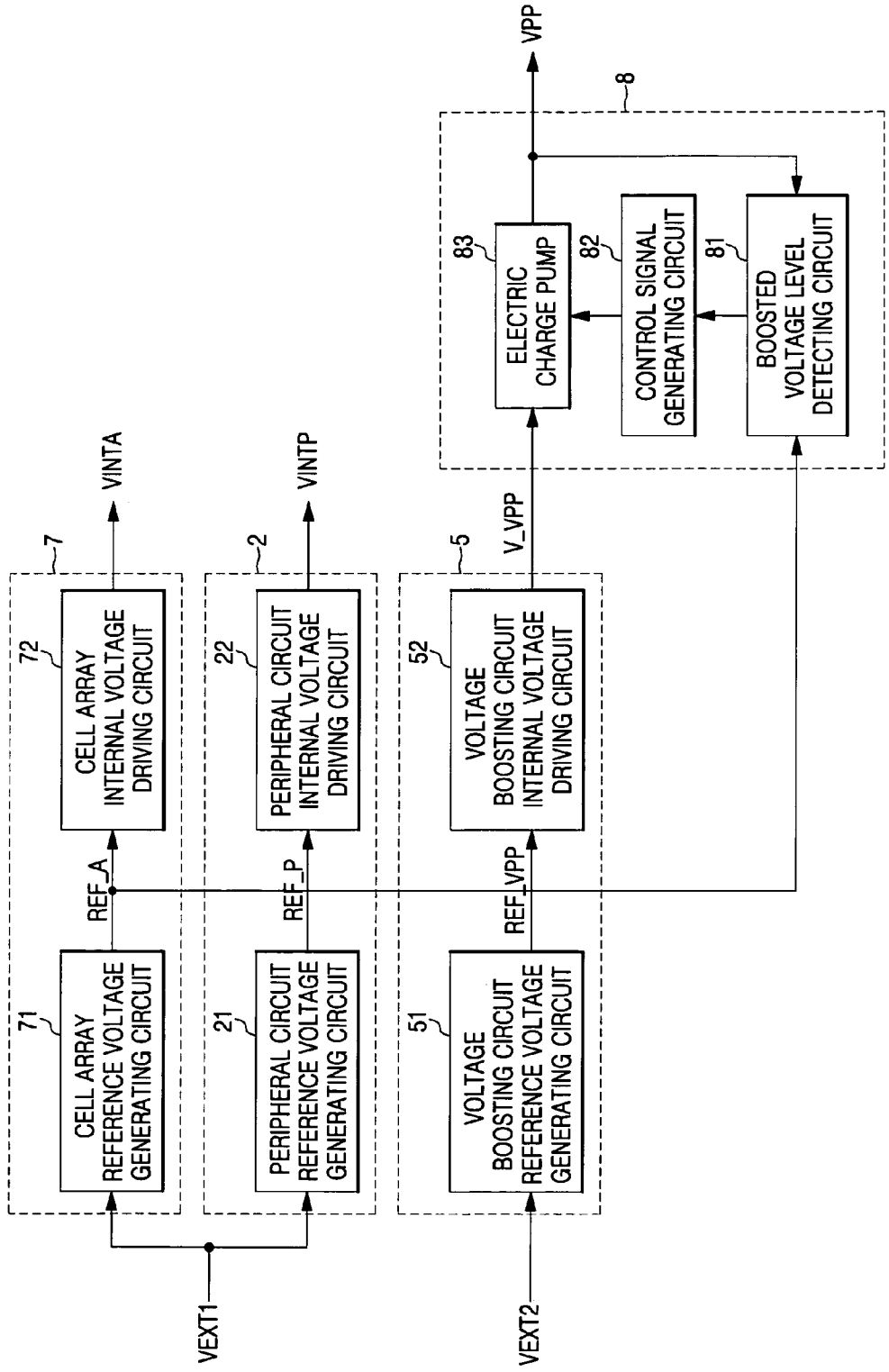
FIG. 4 is a block diagram illustrating a semiconductor memory device according to an embodiment of the present invention.

FIG. 4 is a block diagram illustrating a semiconductor memory device according to an embodiment of the present invention. The semiconductor memory device of FIG. 4 includes a cell array internal voltage generating circuit 7, a peripheral circuit internal voltage generating circuit 2, a voltage boosting circuit power voltage generating circuit 5, and a voltage boosting circuit 8.

The cell array internal voltage generating circuit 7 includes a reference voltage generating circuit 71 and an internal voltage driving circuit 72. The peripheral circuit internal voltage generating circuit 2 includes a reference voltage generating circuit 21 and an internal voltage driving circuit 22. The voltage boosting circuit power voltage generating circuit 5 includes a reference voltage generating circuit 51 and an internal voltage driving circuit 52.

The voltage boosting circuit 8 includes a boosted voltage level detecting circuit 81, a control signal generating circuit 82, and an electric charge pump circuit 83.

The semiconductor memory device of FIG. 4 is supplied with external power voltages VEXT1 and VEXT2 like the semiconductor memory device of FIG. 2.

Like reference numerals of FIGS. 2 and 4 denote like parts and perform like operations.

The reference voltage generating circuit 71 generates a cell array reference voltage REF_A having a prescribed level from the external power voltage VEXT1, and applies the cell array reference voltage REF_A to the internal voltage driving circuit 72 and the voltage boosting circuit 8.

The internal voltage driving circuit 72 generates the cell array internal voltage VINTA from the external power voltage VEXT1 according to the cell array reference voltage REF_A and applies it to the cell array.

The boosted voltage level detecting circuit 81 of the voltage boosting circuit detects a voltage level of the boosted voltage VPP and drives the control signal generating circuit 82 when the detected boosted voltage level is lower than the cell array reference voltage REF_A. The control signal generating circuit 82 generates a control signal under control of the boosted voltage level detecting circuit 81. The electric charge pump circuit 83 performs charge pumping operation using the external power voltage VEXT2 in response to the control signal to raise the voltage level of the boosted voltage VPP.

Operation of the semiconductor memory device of FIG. 4 is explained below.

The semiconductor memory device is supplied with external power voltages VEXT1 and VEXT2 as shown in FIG. 3.

The cell array internal voltage generating circuit 7 generates the cell array reference voltage REF_A and the cell array internal voltages VINTA from the external power voltage VEXT1. The peripheral circuit internal voltage generating circuit 2 generates the peripheral circuit reference voltage REF_P and the peripheral circuit internal voltage VINTP from the external power voltage VEXT1.

The voltage boosting circuit power voltage generating circuit 5 generates the voltage boosting circuit reference voltage REF_VPP having a high voltage level, higher than a voltage level of the cell array reference voltage REF_A or the peripheral circuit reference voltage REF_P, from the external power voltage VEXT2.

The voltage boosting circuit 8 performs the electric charge pumping operation using the voltage boosting circuit power voltage V_VPP having a high voltage level to raise the voltage level of the boosted voltage VPP when the boosted voltage VPP is lower in voltage level than the cell array reference voltage REF_A.

Figure 5:
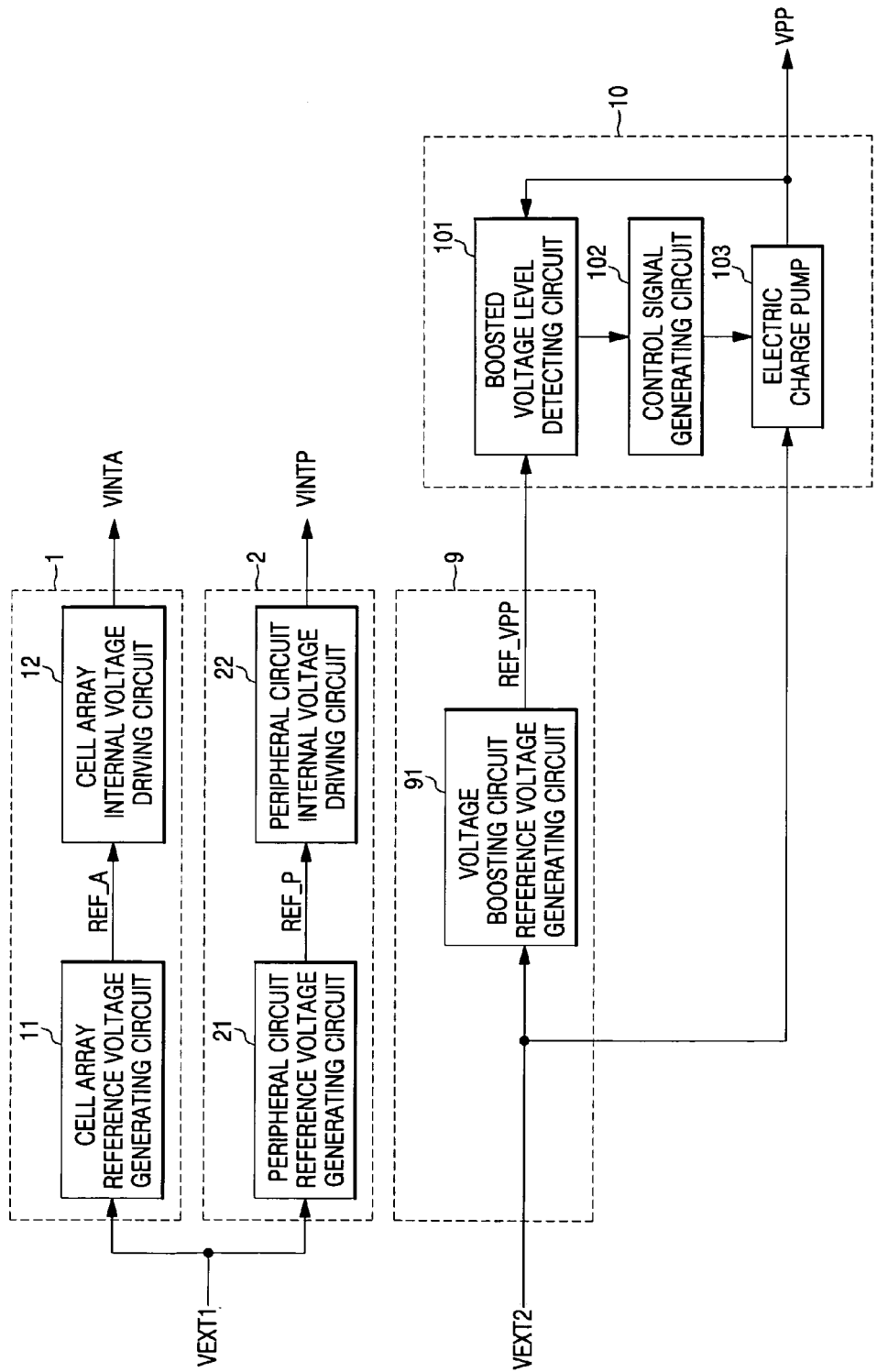
FIG. 5 is a block diagram illustrating a semiconductor memory device according to an embodiment of the present invention.

FIG. 5 is a block diagram illustrating a semiconductor memory device according to an embodiment of the present invention. The semiconductor memory device of FIG. 5 includes a cell array internal voltage generating circuit 1, a peripheral circuit internal voltage generating circuit 2, a voltage boosting circuit power voltage generating circuit 9, and a voltage boosting circuit 10. The cell array internal voltage generating circuit 1 includes a reference voltage generating circuit 11 and an internal voltage driving circuit 12. The peripheral circuit internal voltage generating circuit 2 includes a reference voltage generating circuit 21 and an internal voltage driving circuit 22. The voltage boosting circuit power voltage generating circuit 9 includes a reference voltage generating circuit 91. The voltage boosting circuit 10 includes a boosted voltage level detecting circuit 101, a control signal generating circuit 102, and an electric charge pump circuit 103.

The semiconductor memory device of FIG. 5 is supplied with external power voltages VEXT1 and VEXT2 like the semiconductor memory device of FIG. 2.

Like reference numerals of FIGS. 2 and 5 denote like parts and perform like operations.

The voltage boosting circuit power voltage generating circuit 9 generates the voltage boosting circuit reference voltage REF_VPP through the reference voltage generating circuit 91. The voltage boosting circuit reference voltage REF_VPP as the reference voltage and the external power voltage VEXT2 as the voltage boosting circuit power voltage or operating voltage are applied to the voltage boosting circuit 10.

The boosted voltage level detecting circuit 101 of the voltage boosting circuit 10 detects a voltage level of the boosted voltage VPP and drives the control signal generating circuit 102 when the detected boosted voltage level is lower than the voltage boosting circuit reference voltage REF_VPP. The control signal generating circuit 102 generates a control signal under control of the boosted voltage level detecting circuit 101. The electric charge pump circuit 103 performs charge pumping operation using the external power voltage VEXT2 in response to the control signal to raise the voltage level of the boosted voltage VPP.

Operation of the semiconductor memory device of FIG. 5 is explained below.

The semiconductor memory device is supplied with external power voltages VEXT1 and VEXT2 as shown in FIG. 3.

The cell array and peripheral circuit internal voltage generating circuits 1 and 2 respectively generate the cell array and peripheral circuit internal voltages VINTA and VINTP from the external power voltage VEXT1. The voltage boosting circuit power voltage generating circuit 9 generates the voltage boosting circuit reference voltage REF_VPP having a high voltage level, higher than the voltages of the cell array and peripheral circuit internal voltages VINTA and VINTP, from the external power voltage VEXT2.

The voltage boosting circuit 10 performs the electric charge pumping operation using the voltage boosting circuit power voltage V_VPP having a high voltage level to raise the voltage level of the boosted voltage VPP when the boosted voltage VPP is lower in voltage level than the voltage boosting circuit reference voltage REF_VPP.

Figure 6:
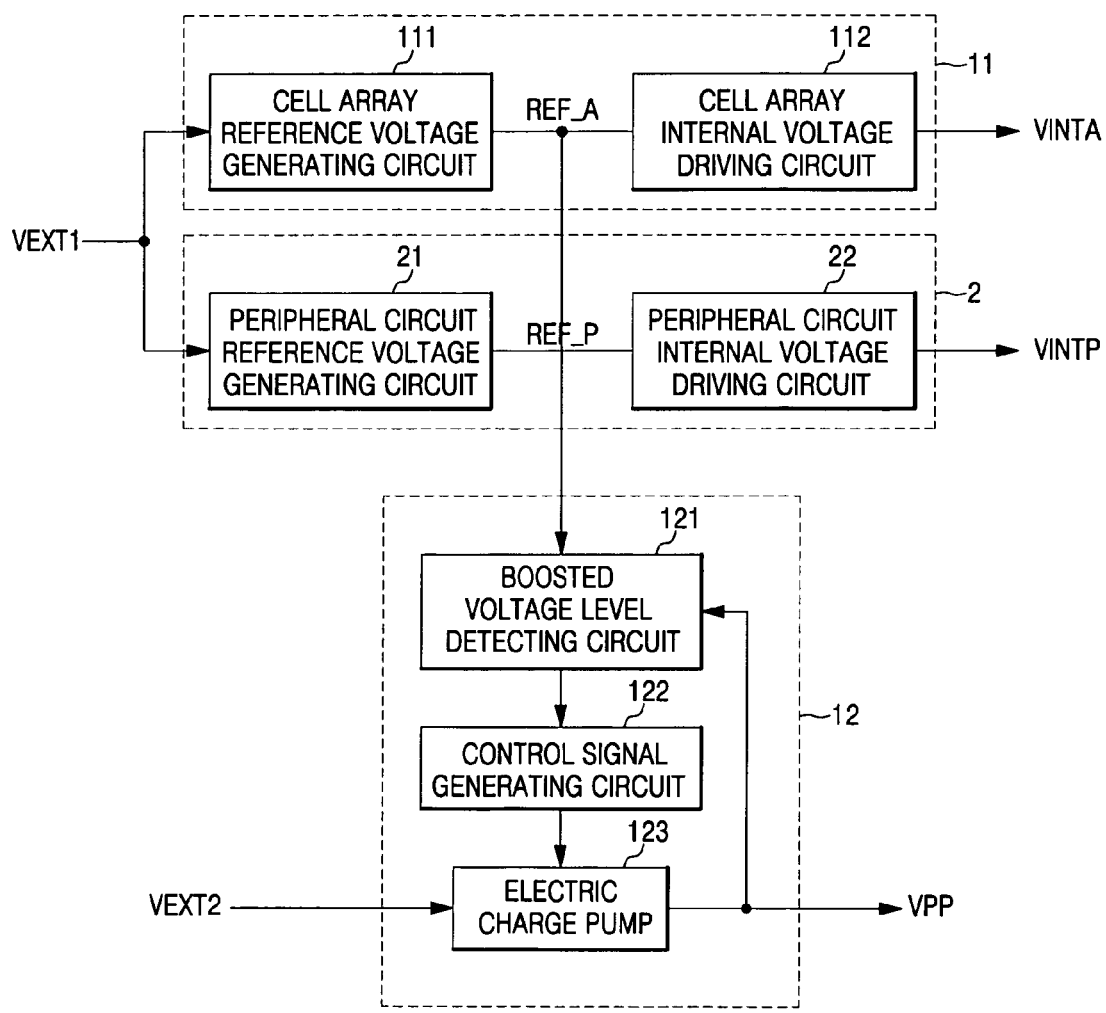
FIG. 6 is a block diagram illustrating a semiconductor memory device according to an embodiment of the present invention.

FIG. 6 is a block diagram illustrating a semiconductor memory device according to an embodiment of the present invention. The semiconductor memory device of FIG. 6 includes a cell array internal voltage generating circuit 11, a peripheral circuit internal voltage generating circuit 2, and a voltage boosting circuit 12. The cell array internal voltage generating circuit 11 includes a reference voltage generating circuit 111 and an internal voltage driving circuit 112. The peripheral circuit internal voltage generating circuit 2 includes a reference voltage generating circuit 21 and an internal voltage driving circuit 22. The voltage boosting circuit 12 includes a boosted voltage level detecting circuit 121, a control signal generating circuit 122, and an electric charge pump circuit 123.

The semiconductor memory device of FIG. 6 is supplied with external power voltages VEXT1 and VEXT2 like the semiconductor memory device of FIG. 2. Like reference numerals of FIGS. 2 and 6 denote like parts and perform like operations.

The reference voltage generating circuit 111 generates a cell array reference voltage REF_A having a prescribed level from the external power voltage VEXT1, and applies the cell array reference voltage REF_A to the internal voltage driving circuit 112 and the voltage boosting circuit 12.

The internal voltage driving circuit 112 generates the cell array internal voltage VINTA from the external power voltage VEXT1 according to the cell array reference voltage REF_A and applies it to the cell array.

The boosted voltage level detecting circuit 121 of the voltage boosting circuit detects a voltage level of the boosted voltage VPP and drives the control signal generating circuit 122 when the detected boosted voltage level is lower than the cell array reference voltage REF_A. The control signal generating circuit 122 generates a control signal under control of the boosted voltage level detecting circuit 121. The electric charge pump circuit 123 performs charge pumping operation using the external power voltage VEXT2 in response to the control signal to raise the voltage level of the boosted voltage VPP.

Operation of the semiconductor memory device of FIG. 6 is explained below.

The semiconductor memory device is supplied with external power voltages VEXT1 and VEXT2 as shown in FIG. 3.

The cell array internal voltage generating circuit 11 generates the cell array reference voltage REF_A and the cell array circuit internal voltage VINTA from the external power voltage VEXT1. The peripheral circuit internal voltage generating circuit 2 generates the peripheral circuit reference voltage REF_P and the peripheral circuit internal voltage VINTP from the external power voltage VEXT1.

The voltage boosting circuit 12 performs the electric charge pumping operation using the external power voltage VEXT2 having a high voltage level to raise the voltage level of the boosted voltage VPP when the boosted voltage VPP is lower in voltage level than the voltage cell array reference voltage REF_A.

Figure 7:
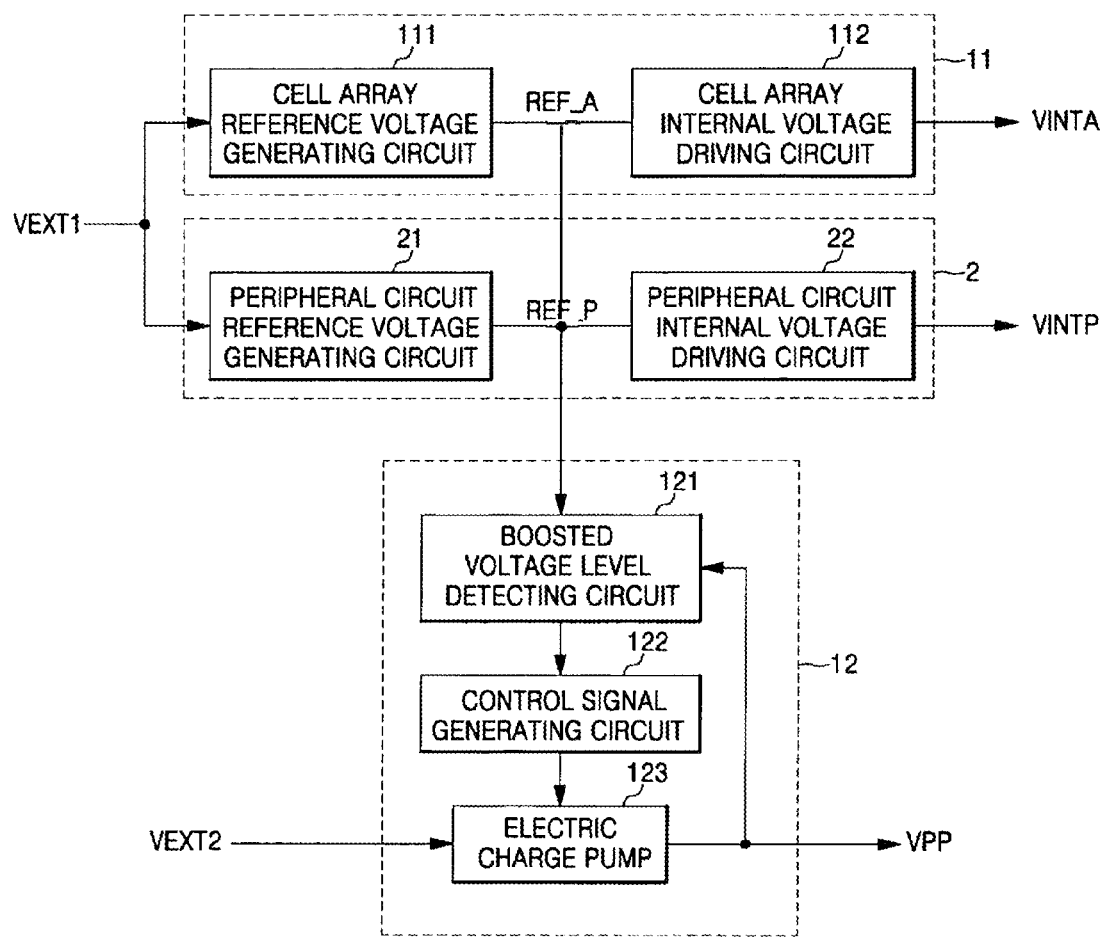
FIG. 7 is a block diagram illustrating a semiconductor memory device according to an embodiment of the present invention.

The voltage boosting circuit 12 of FIG. 6 is supplied with the cell array reference voltage REF_A, but it can be understood that it can be supplied with other reference voltages (e.g., peripheral circuit reference voltage REF_P as shown in FIG. 7).

As described above, a semiconductor memory device according to an embodiment of the present invention generates the boosted voltage and controls it to thereby raise the voltage level of the boosted voltage by a desired level. As a result, the voltage boosting circuit of the semiconductor memory device stably generates the boosted voltage having a high voltage level during the low power operation.

What is claimed is:

1. A semiconductor memory device, comprising:
  a cell array internal voltage generating circuit for generating a cell array reference voltage and a cell array internal voltage from a first external power voltage;
  a peripheral circuit internal voltage generating circuit for generating a peripheral circuit reference voltage and a peripheral circuit internal voltage from the first external power voltage;
  a voltage boosting circuit power voltage generating circuit for generating a voltage boosting circuit reference voltage and a voltage boosting circuit power voltage from a second external power voltage; and
  a voltage boosting circuit for generating a boosted voltage directly receiving one of the cell array reference voltage and the peripheral circuit reference voltage, and the voltage boosting circuit power voltage and generates the boosted voltage using the one of the cell array reference voltage and the peripheral circuit reference voltage, and the voltage boosting circuit power voltage.

2. The device of claim 1, wherein the second external power voltage is higher in voltage level than the first external power voltage.

3. The device of claim 1, wherein the voltage boosting circuit power voltage generating circuit comprises:
  a voltage boosting circuit reference voltage generating circuit for receiving the second external power voltage to generate the voltage boosting circuit reference voltage having a prescribed level; and
  a voltage boosting circuit internal voltage driving circuit for generating the voltage boosting power voltage from the second external power voltage in response to the voltage boosting circuit reference voltage.

4. The device of claim 1, wherein the cell array internal voltage generating circuit comprises:
  a cell array reference voltage generating circuit for receiving the first external power voltage to generate the cell array reference voltage having a prescribed level; and
  a cell array internal voltage driving circuit for generating the cell array internal voltage from the first external power voltage according to the cell array reference voltage.

5. The device of claim 1, wherein the peripheral circuit internal voltage generating circuit comprises:
- a peripheral circuit reference voltage generating circuit for receiving the first external power voltage to generate the peripheral circuit reference voltage having a prescribed level; and
- a peripheral circuit internal voltage driving circuit for generating the peripheral circuit internal voltage from the first external power voltage according to the peripheral circuit reference voltage.

6. A semiconductor memory device, comprising:
- a cell array internal voltage generating circuit for generating a cell array reference voltage and a cell array internal voltage from a first external power voltage;
- a peripheral circuit internal voltage generating circuit for generating a peripheral circuit reference voltage and a peripheral circuit internal voltage from the first external power voltage; and
- a voltage boosting circuit for generating a boosted voltage, the voltage boosting circuit directly receiving one of the cell array reference voltage and the peripheral circuit reference voltage, and a second external power voltage, and generating the boosted voltage using one of the cell array reference voltage and the peripheral circuit reference voltage, and the second external power voltage.

7. The device of claim 6, wherein the second external power voltage is higher in voltage level than the first external power voltage.

* * * * *